(12) United States Patent
Tekumalla et al.

(10) Patent No.: US 8,738,978 B2
(45) Date of Patent: May 27, 2014

(54) EFFICIENT WRAPPER CELL DESIGN FOR SCAN TESTING OF INTEGRATED

(75) Inventors: Ramesh C. Tekumalla, Breinigsville, PA (US); Partho Tapan Chaudhuri, Pune (IN); Priyesh Kumar, Pune (IN); Komal N. Shah, Mumbai (IN)

(73) Assignee: LSI Corporation, San Jose, CA (US)

( * ) Notice: Subject to any disclaimer, the term of this patent is extended or adjusted under 35 U.S.C. 154(b) by 432 days.

(21) Appl. No.: 13/173,144

(22) Filed: Jun. 30, 2011

(65) Prior Publication Data

US 2013/0007547 A1   Jan. 3, 2013

(51) Int. Cl.
*G01R 31/28* (2006.01)
*G01R 31/3185* (2006.01)
*G06F 11/267* (2006.01)

(52) U.S. Cl.
CPC  *G01R 31/318533* (2013.01); *G01R 31/318536* (2013.01); *G01R 31/318555* (2013.01); *G01R 31/318572* (2013.01); *G01R 31/318541* (2013.01); *G06F 11/267* (2013.01)
USPC ............ 714/727; 714/726; 714/729; 714/733

(58) Field of Classification Search
CPC ............... G01R 31/318533; G01R 31/318536; G01R 31/318555; G01R 31/318572; G01R 31/318541; G06F 11/267
USPC .......... 714/726, 727, 729, 733; 716/101, 106, 716/110
See application file for complete search history.

(56) References Cited

U.S. PATENT DOCUMENTS

| | | | | |
|---|---|---|---|---|
| 7,308,631 B2 * | 12/2007 | McLaurin | ...................... | 714/726 |
| 7,380,181 B2 * | 5/2008 | Goel | .............................. | 714/724 |
| 7,409,611 B2 * | 8/2008 | Whetsel | ........................ | 714/726 |
| 7,653,849 B1 * | 1/2010 | Tabatabaei | .................... | 714/726 |
| 7,831,876 B2 | 11/2010 | Goyal et al. | | |

(Continued)

FOREIGN PATENT DOCUMENTS

KR     20070007092 A    1/2007

OTHER PUBLICATIONS

Quasem, Md.S.; Gupta, S., "Designing reconfigurable multiple scan chains for systems-on-chip," VLSI Test Symposium, 2004. Proceedings. 22nd IEEE , vol., No., pp. 365,371, Apr. 25-29, 2004.*

(Continued)

*Primary Examiner* — Cynthia Britt
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises a plurality of scan chains, including at least one wrapper cell scan chain arranged between first and second circuitry cores of the additional circuitry, with the wrapper cell scan chain comprising a plurality of wrapper cells and being configurable to operate as a serial shift register in a scan shift mode of operation. At least one of the wrapper cells of the wrapper cell scan chain comprises a flip-flop having a throughput data path that is part of a scan shift path of the wrapper cell scan chain and not part of a functional path between the first and second circuitry cores. In an HDD controller embodiment, the first and second circuitry cores may comprise respective read channel and additional cores of a system-on-chip.

20 Claims, 3 Drawing Sheets

(56) References Cited

U.S. PATENT DOCUMENTS

| | | | |
|---|---|---|---|
| 7,941,717 B2* | 5/2011 | Waayers | 714/727 |
| 8,032,806 B1* | 10/2011 | Tabatabaei | 714/727 |
| 2005/0096876 A1 | 5/2005 | Jang et al. | |
| 2011/0016364 A1 | 1/2011 | Varadarajan et al. | |

OTHER PUBLICATIONS

E.J. Marinissen et al., "Wrapper Design for Embedded Core Test," Proceedings International Test Conference, Oct. 2000, pp. 911-920.

V. Iyengar et al., "Efficient Wrapper/TAM Co-Optimization for Large SOCs," Proceedings Design, Automation and Test in Europe, 2002, pp. 491-498.

Y. Wu et al., "Testing ASICs with Multiple Identical Cores," IEEE Transactions on Computer-Aided Design of Integrated Circuits and Systems, Mar. 2003, pp. 327-336, vol. 22, No. 3.

F. Dasilva et al., "Overview of the IEEE P1500 Standard," Proceedings International Test Conference (ITC), Sep.-Oct. 2003, pp. 988-997.

Ramesh C. Tekumalla, "Delay Fault Testing of Interconnect Logic Between Embedded Cores," Proceedings of the 12th IEEE European Test Symposium, 2007, 6 pages.

* cited by examiner

US 8,738,978 B2

EFFICIENT WRAPPER CELL DESIGN FOR SCAN TESTING OF INTEGRATED

FIELD OF THE INVENTION

The present invention relates generally to integrated circuit testing, and more particularly to integrated circuit testing using scan test circuitry.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results.

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

Many integrated circuits include multiple distinct circuitry cores. For example, an integrated circuit utilized in a hard disk drive (HDD) application may comprise a system-on-chip (SOC) with multiple cores, including a read channel core and at least one other core. A problem that arises is that the read channel core is typically very large, which makes it difficult to accommodate both the read channel core and the rest of the SOC in the same test mode. As a result, in conventional arrangements, a significant number of functional paths going into and out of the read channel may remain untested. In such arrangements, wrapper cells may be used to form a scan chain around each of one or more cores in order to allow interconnect paths between those cores to be tested. However, conventional techniques for implementing wrapper scan chains are generally not area or timing efficient, and therefore may unduly increase the size and cost of the integrated circuit while also adversely impacting its performance.

It should be noted that the above problem is not limited to integrated circuits that include SOCs with read channel cores. Similar issues can arise in a wide variety of other types of integrated circuits that comprise multiple distinct circuitry cores.

SUMMARY OF THE INVENTION

Illustrative embodiments of the invention provide improved circuitry and techniques for scan testing of integrated circuits. For example, in one or more such embodiments, scan test circuitry is configured to include at least one scan chain of wrapper cells arranged between at least first and second circuitry cores of the integrated circuit. The wrapper cells utilize an area and timing efficient design that facilitates testing of all functional paths between the cores when the cores are subject to separate scan testing.

In one aspect, an integrated circuit comprises scan test circuitry and additional circuitry subject to testing utilizing the scan test circuitry. The scan test circuitry comprises a plurality of scan chains, including at least one wrapper cell scan chain arranged between first and second circuitry cores of the additional circuitry, with the wrapper cell scan chain comprising a plurality of wrapper cells and being configurable to operate as a serial shift register in a scan shift mode of operation. At least one of the wrapper cells of the wrapper cell scan chain comprises a flip-flop having a throughput data path that is part of a scan shift path of the wrapper cell scan chain and not part of a functional path between the first and second circuitry cores. In an HDD controller embodiment, the first and second circuitry cores may comprise respective read channel and additional cores of an SOC.

In another aspect, a wrapper cell for use in a wrapper cell scan chain of an integrated circuit comprises a multiplexer having a functional path input, a scan shift input, a select line and an output, and a flip-flop having a data input and a data output. The functional path input of the multiplexer is coupled to a functional path output of a first circuitry core of the integrated circuit, the select line of the multiplexer is adapted to receive a scan shift enable signal, and the output of the multiplexer is coupled to the data input of the flip-flop and to a functional path input of a second circuitry core of the integrated circuit. The data output of the flip-flop is coupled to a scan shift input of another multiplexer in a next wrapper cell of the wrapper cell scan chain. The scan shift input of the multiplexer is coupled to a data output of another flip-flop of a previous wrapper cell of the wrapper cell scan chain.

Such a wrapper cell configuration considerably facilitates testing of functional paths between the first and second circuitry cores, particularly when the scan test circuitry is configured for separate scan testing of the first and second circuitry cores. For example, a wrapper cell scan chain including wrapper cells of this type may be configured such that functional paths between the first circuitry core and the wrapper cell scan chain are scan tested in conjunction with scan testing of the first circuitry core and functional paths between the wrapper cell scan chain and the second circuitry core are scan tested in conjunction with scan testing of the second circuitry core. As a result, significantly improved test coverage is provided for integrated circuits that include multiple cores.

DETAILED DESCRIPTION OF THE INVENTION

The invention will be illustrated herein in conjunction with exemplary testing systems and corresponding integrated circuits comprising scan test circuitry for supporting scan testing of other internal circuitry of those integrated circuits. It should be understood, however, that the invention is more generally applicable to any testing system or associated integrated circuit in which it is desirable to provide test coverage of functional paths between potentially large circuitry cores of the integrated circuit.

Figure 1:
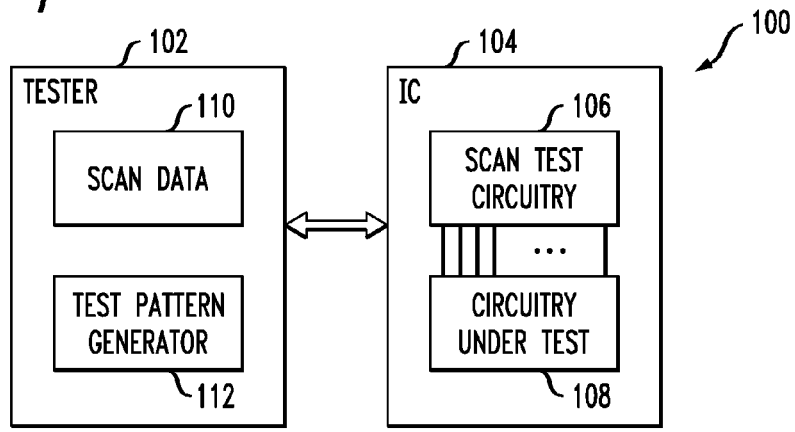
FIG. 1 is a block diagram showing an integrated circuit testing system comprising a tester and an integrated circuit under test in an illustrative embodiment.

FIG. 1 shows a testing system 100 comprising a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the system 100 may be implemented, by way of example and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and the invention is not limited in this regard. However, certain embodiments such as those shown in FIGS. 2 through 5 will be described primarily in the context of noncompressed scan testing.

Figure 2:
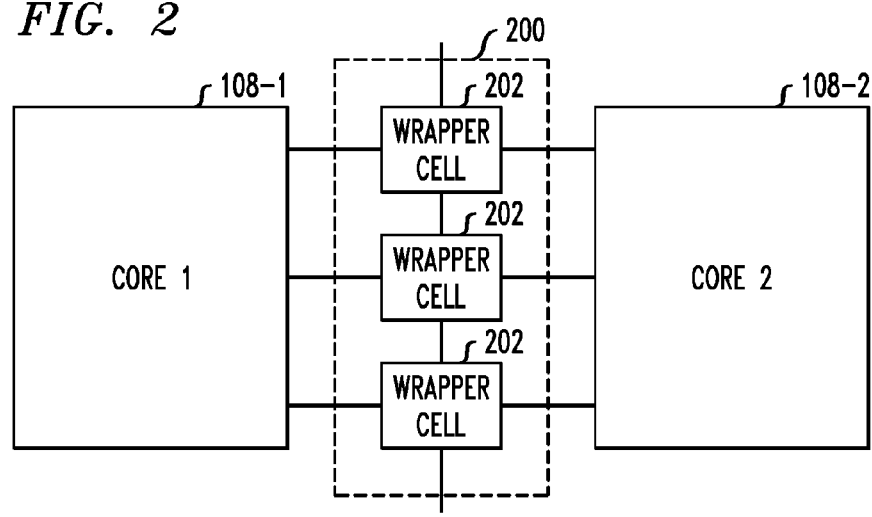
FIG. 2 illustrates one example of the manner in which a scan chain of wrapper cells may be arranged between circuitry cores in the integrated circuit of FIG. 1.

Referring now to FIG. 2, portions of one potential configuration of the integrated circuit 104 are shown in greater detail. In this scan testing arrangement, the scan test circuitry 106 comprises a wrapper cell scan chain 200 that includes a plurality of wrapper cells 202. The wrapper cell scan chain is arranged between first and second circuitry cores 108-1 and 108-2 of the integrated circuit 104. The first and second circuitry cores are also denoted Core 1 and Core 2 in the figure, and may comprise, for example, respective read channel and additional cores of an SOC in an HDD controller. It is to be appreciated, however, that the present invention does not require any particular types of circuitry cores. An embodiment in which the cores comprise respective read channel and SOC cores will be described in greater detail below in conjunction with FIGS. 4 and 5.

The wrapper cell scan chain 200 of FIG. 2 is configurable to operate as a serial shift register in a scan shift mode of operation of the integrated circuit 104. In this mode of operation, scan test input data from the tester 102 is shifted into the scan chain 200, and scan test output data is shifted out of the scan chain 200 for delivery back to the tester 102. Additional details regarding the operation of scan circuitry of an integrated circuit may be found in the above-cited U.S. Pat. No. 7,831,876.

Although FIG. 2 shows only two circuitry cores 108 with a single wrapper cell scan chain arranged between them, this is by way of example only, and other embodiments may comprise more than two cores, as well as multiple wrapper cell scan chains arranged to provide test coverage for functional paths between those cores. These and other embodiments may also include a variety of other types of scan chains, with potentially different types and arrangements of scan cells.

As noted previously, a problem with conventional arrangements is that it can be difficult to obtain complete test coverage of functional paths between circuitry cores that are subject to separate scan testing. The wrapper cell scan chain 200 in the present embodiment is advantageously configured to overcome this problem. More particularly, the wrapper cells 202 of the wrapper cell scan chain 200 utilize an area and timing efficient design that facilitates testing of all functional paths between the circuitry cores 108-1 and 108-2 when the cores are subject to separate scan testing.

It will therefore be assumed that in the present embodiment, the scan test circuitry 106 further comprises, in addition to the wrapper cell scan chain 200, additional scan chains and associated control circuitry for separate scan testing of the first and second circuitry cores 108-1 and 108-2. These additional scan chains and control circuitry are not explicitly shown in FIG. 2. However, the wrapper cell scan chain 200 operates in conjunction with the separate scan testing of the first and second circuitry cores 108-1 and 108-2. For example, as will be described below, the wrapper cell scan chain 200 is advantageously configured such that functional paths between the first circuitry core 108-1 and the wrapper cell scan chain 200 are scan tested in conjunction with scan testing of the first circuitry core and functional paths between the wrapper cell scan chain 200 and the second circuitry core 108-2 are scan tested in conjunction with scan testing of the second circuitry core.

Figure 3:
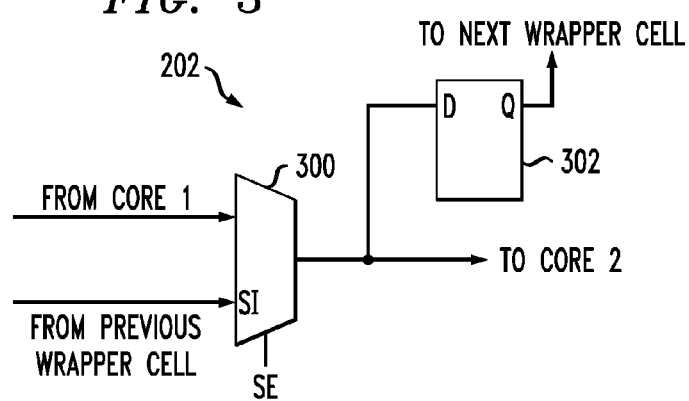
FIG. 3 is a schematic diagram of a given one of the wrapper cells of FIG. 2.

FIG. 3 shows a particular one of the wrapper cells 202 of the wrapper cell scan chain 200. The particular wrapper cell shown is assumed to be neither an initial wrapper cell of the chain or a final wrapper cell of the chain, but is instead an intermediate wrapper cell of the chain, and accordingly receives an input from a previous wrapper cell of the chain and delivers an output to a next wrapper cell of the chain, as indicated in the figure.

The wrapper cell 202 in this embodiment comprises a multiplexer 300 and a flip-flop 302. The multiplexer 300 has a functional path input, a scan shift input (SI), a select line and an output, and the flip-flop 302 has a data input and a data output. It should be noted that the flip-flop will also have a clock input, which is not explicitly shown, and may have other inputs. However, in this embodiment, it is assumed that the flip-flop 302 is a non-resettable flip-flop. The functional path input of the multiplexer 300 is coupled to a functional path output of the first circuitry core 108-1, the select line of the multiplexer is adapted to receive a scan shift enable (SE) signal, and the output of the multiplexer is coupled to the data input of the flip-flop 302 and to a functional path input of the second circuitry core 108-2. Also, the data output of the flip-flop is coupled to a scan shift input of another multiplexer in a next wrapper cell of the wrapper cell scan chain, and the scan shift input of the multiplexer is coupled to a data output of another flip-flop of a previous wrapper cell of the wrapper cell scan chain.

The FIG. 3 wrapper cell embodiment is one example of an arrangement in which a wrapper cell flip-flop 302 has a throughput data path that is part of a scan shift path of the corresponding wrapper cell scan chain 200 but is not part of a functional path between the first and second circuitry cores 108-1 and 108-2. Removing the flip-flop from the functional path allows for an area and timing efficient design while also facilitating test coverage of interconnects between the different circuitry cores. The flip-flop 302 in this embodiment is implemented as a non-scan flip-flop, and accordingly has a significantly smaller area than a conventional scan flip-flop. Removing the flip-flop 302 from the functional path between the cores reduces the timing impact of the wrapper cell since only the multiplexer 300 remains on the functional path.

The other wrapper cells 202 of the wrapper cell scan chain 200 are also configured in a manner similar to that shown in FIG. 3. As a result, the wrapper cell scan chain 200 in the present embodiment is configured such that a scan shift input of a given wrapper cell 202 other than an initial wrapper cell of the wrapper cell scan chain is coupled to a data output of a flip-flop of a previous wrapper cell of the wrapper cell scan chain. Also, a data output of a flip-flop of a given wrapper cell 202 other than a final wrapper cell of the wrapper cell scan chain is coupled to a scan shift input of a next wrapper cell of the wrapper cell scan chain.

Furthermore, the wrapper cell scan chain 200 is configured such that each wrapper cell 202 has a functional path input that is coupled to a functional path output of the first circuitry core 108-1 and a functional path output that is coupled to a functional path input of the second circuitry core 108-2.

It should be noted that the SE signal applied to the wrapper cells 202 is separate from the regular scan shift enable used in scan testing the first and second circuitry cores. The scan shift input of the initial wrapper cell of the wrapper cell scan chain comes from a wrapper scan-in port of the integrated circuit 104, and the scan shift output of the final wrapper cell of the wrapper cell scan chain comes from a wrapper scan-out port of the integrated circuit 104. Also, the clock signal applied to the wrapper cells is separate from the regular scan clock used in scan testing the first and second circuitry cores, and may be supplied by a wrapper clock input of the integrated circuit 104.

Such a wrapper cell configuration considerably facilitates testing of functional paths between the first and second circuitry cores 108-1 and 108-2, particularly when the scan test circuitry 106 is configured for separate scan testing of the first and second circuitry cores. For example, the wrapper cell scan chain 200 including wrapper cells 202 of this type is configured such that functional paths between the first circuitry core and the wrapper cell scan chain are scan tested in conjunction with scan testing of the first circuitry core and functional paths between the wrapper cell scan chain and the second circuitry core are scan tested in conjunction with scan testing of the second circuitry core. This two-phase scan testing approach results in all of the functional paths being covered in one scan testing phase or the other. As a result, significantly improved test coverage is provided for integrated circuits that include multiple cores.

Figure 4:
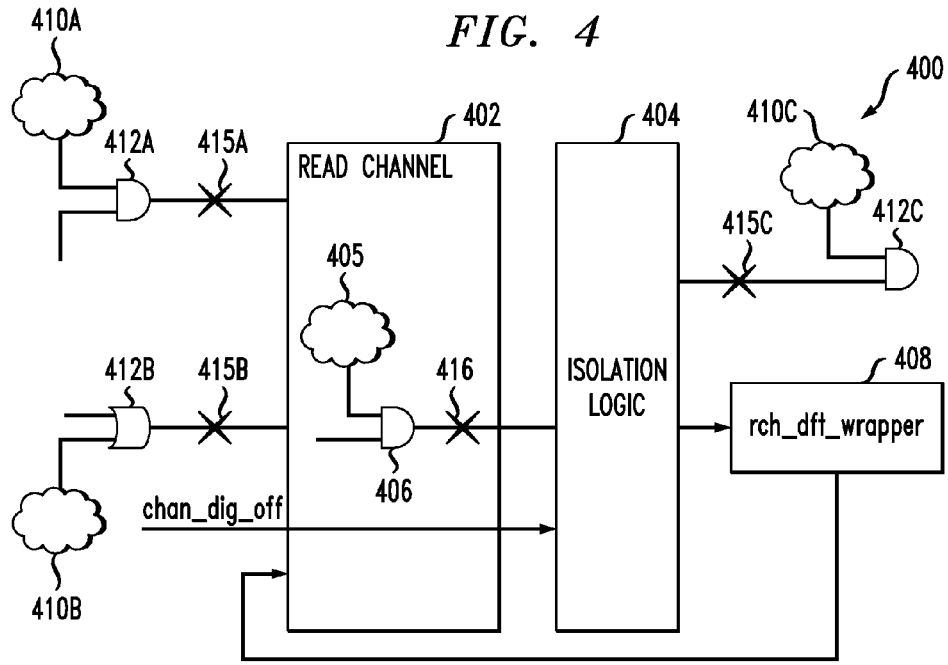
FIGS. 4 and 5 illustrate implementation of a chain of wrapper cells around a read channel core in an HDD controller embodiment of the invention.
Figure 5:
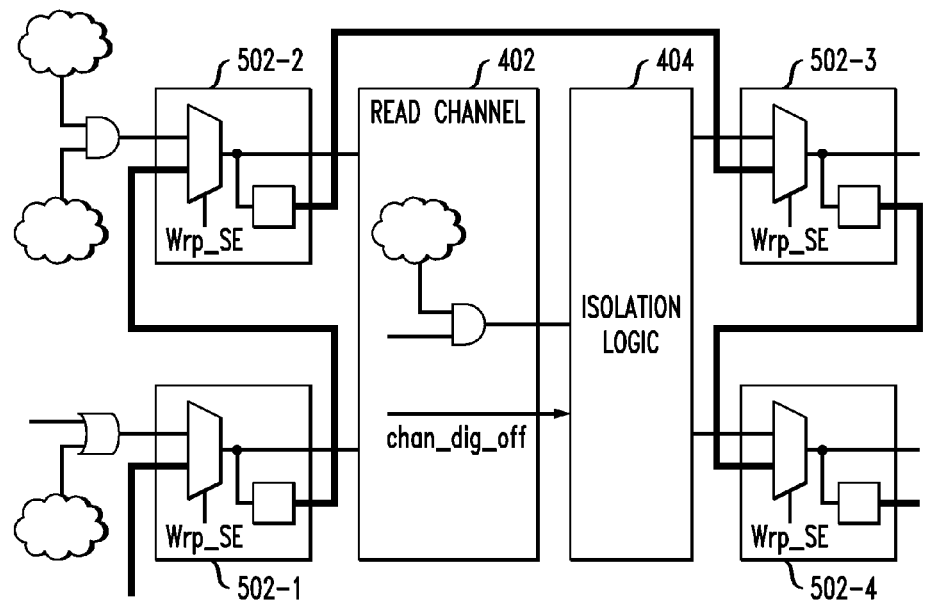

Referring now to FIGS. 4 and 5, in this embodiment a wrapper cell scan chain such as scan chain 200 is implemented in an HDD controller integrated circuit 400, which comprises a read channel core 402 and one or more additional cores of an SOC. The outputs from the read channel core 402 pass through isolation logic block 404 before going to another core of the SOC. Also, outputs from another core of the SOC are applied to inputs of the read channel core 402. Internal circuitry 405 is coupled via logic gate 406 to the isolation logic 404.

A read channel wrapper cell scan chain, also referred to herein as simply a "wrapper," is generally denoted as rch_d-ft_wrapper 408, and is coupled between outputs of the isolation logic 404 and inputs of the read channel core 402. The other SOC cores comprise circuitry 410A, 410B and 410C and associated logic gates 412A, 412B and 412C. FIG. 4 also shows a number of interconnects 415A, 415B, 415C and 416 between the read channel core 402 and the other SOC cores that will be coupled to the individual wrapper cells of the wrapper 408 as will be described in conjunction with FIG. 5. The chan_dig_off signal is a power shut off signal to keep the read channel in a low power mode. During scan testing of the read channel, the read channel is not in the low power mode, meaning the chan_dig_off is disabled.

The wrapper 408 in FIG. 4 is an artificial design module created to facilitate the test wrapper insertion in designing the integrated circuit 400. It comprises buffers between its inputs and outputs. The outputs of this wrapper drive the inputs of the read channel core 402 and the inputs to this wrapper come from the read channel core 402. While scan testing the other SOC cores, the read channel core may be considered a "black box," and vice versa. Therefore, during scan testing of the other SOC cores, the outputs of the wrapper 408 are deterministic but its inputs are unknowns. Similarly, during scan testing of the read channel core 402, the inputs of the wrapper 408 are deterministic but its outputs are unknowns. The wrapper is configured in such a way that the unknowns described above deterministic during separate scan testing of the read channel and other SOC cores.

In designing the integrated circuit 400, a wrapper cell of the type shown in FIG. 3 is instantiated on every interface signal of rch_dft_wrapper 408. The wrapper cells are connected with one another to form a wrapper cell scan chain. FIG. 5 shows four exemplary cells of this chain, denoted 502-1, 502-2, 502-3 and 502-4, each configured in the manner previously described in conjunction with FIG. 3.

As indicated previously, this wrapper cell scan chain has a separate wrapper clock and a separate wrapper shift enable signal. This facilitates integration of the wrapper chain into an existing scan-inserted netlist of the integrated circuit as an independent flow, using a design for test (DFT) compiler. After the DFT compiler integrates the wrapper chain into the existing design and generates the wrapper test logic, the resulting netlist may be used for automatic test pattern generation, and this embodiment provides the flexibility of activating the wrapper cell scan chains together with the other scan chains or having a separate run in which only the wrapper cell scan chains are activated. Thus, the wrapper cell scan chains can be either activated or deactivated while separate scan testing is being performed on the read channel and other SOC cores.

When testing the SOC cores, any gate that is feeding a read channel input or any gate that is being fed by a read channel output is targeted. During scan shift mode, a known value is made available at the output of the logic gate that is feeding the read channel, and during functional mode the corresponding result is captured by the wrapper cell flip-flop and later shifted out of the wrapper cell scan chain. Similarly, for any gate that is directly fed by the read channel, a known value is propagated to the input of the gate during scan shift mode using the wrapper cells, and then the corresponding result is captured during the functional mode by the flip-flops of the SOC scan chains and later shifted out.

When testing the read channel core, any gate that is directly fed by a read channel input or any gate that directly feeds a read channel output is targeted. Therefore, for a gate on the input side of the read channel, the wrapper cell provides a known value which is captured by the flip-flops of the read channel scan chains during functional mode and later shifted out. Similarly, for a gate on the output side of the read channel, a known value is made available at the output of the gate during scan shift mode, and then the corresponding result is captured during the functional mode and later shifted out.

The area and timing efficient wrapper cell design of FIG. 3 therefore ensures appropriate test coverage of functional paths between circuitry cores, where those paths might otherwise remain untested when the circuitry cores are subject to separate scan testing. Such an arrangement advantageously facilitates the testing of functional paths between separately-tested circuitry cores of an integrated circuit, using a wrapper cell design that is both area and timing efficient.

Figure 6:
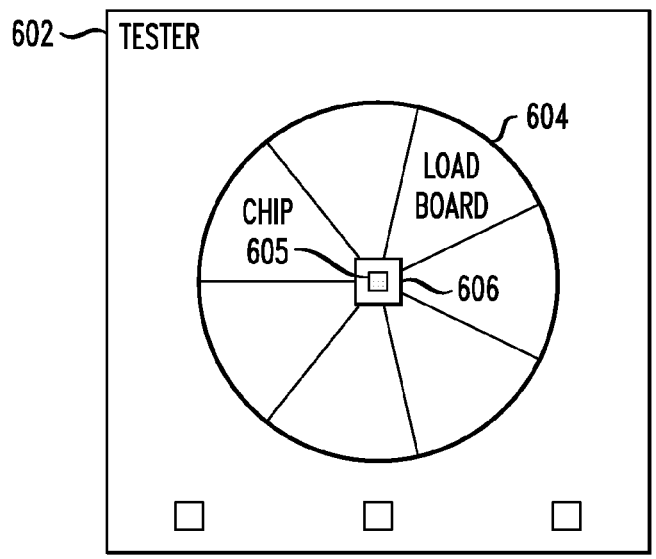
FIG. 6 shows one possible implementation of the testing system of FIG. 1.

The tester 102 in the testing system 100 of FIG. 1 need not take any particular form. One possible example is shown in FIG. 6, in which a tester 602 comprises a load board 604 in which an integrated circuit 605 to be subject to scan testing using the techniques disclosed herein is installed in a central portion 606 of the load board 604. The tester 602 may also comprise processor and memory elements for executing stored computer code, although such elements are not explicitly shown in the figure. Numerous alternative testers may be used to perform scan testing of an integrated circuit as disclosed herein.

Figure 7:
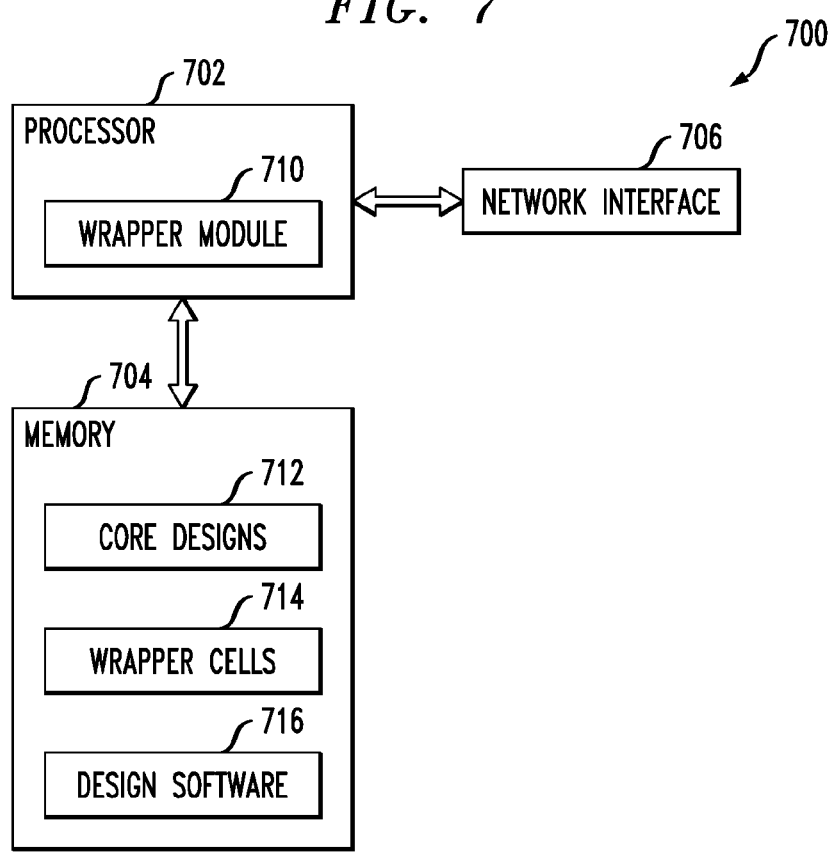
FIG. 7 is a block diagram of a processing system for generating an integrated circuit design comprising scan chains of wrapper cells.

The insertion of wrapper cells to form wrapper cell scan chains in an integrated circuit design may be performed in a processing system 700 of the type shown in FIG. 7. Such a processing system is configured for use in designing integrated circuits such as integrated circuit 104 to include scan test circuitry 106. The processing system 700 comprises a processor 702 coupled to a memory 704. Also coupled to the processor 702 is a network interface 706 for permitting the processing system to communicate with other systems and devices over one or more networks. The network interface 706 may therefore comprise one or more transceivers. The processor 702 implements a wrapper module 710 for supplementing core designs 712 with wrapper cells 714 in the manner disclosed herein, in conjunction with utilization of integrated circuit design software 716.

Elements such as 710, 712, 714 and 716 are implemented at least in part in the form of software stored in memory 704 and processed by processor 702. For example, the memory 704 may store program code that is executed by the processor 702 to implement particular wrapper cell insertion functionality of module 710 within an overall integrated circuit design process. The memory 704 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 702 may comprise a microprocessor, CPU, ASIC, FPGA or other type of processing device, as well as portions or combinations of such devices.

As indicated above, embodiments of the present invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, with different types and arrangements of wrapper cells and wrapper cell scan chains, than those previously described in conjunction with the illustrative embodiments. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the additional circuitry comprising at least first and second circuitry cores;
   the scan test circuitry comprising a plurality of scan chains, including at least one wrapper cell scan chain arranged between the first and second circuitry cores, the wrapper cell scan chain comprising a plurality of wrapper cells and being configurable to operate as a serial shift register in a scan shift mode of operation;
   wherein at least one of the wrapper cells of the wrapper cell scan chain comprises:
   a flip-flop having a data input and a throughput data path that is part of a scan shift path of the wrapper cell scan chain and not part of a functional path between the first and second circuitry cores; and
   a multiplexer having a functional path input, a scan shift input and an output; and
   wherein the output of the multiplexer is coupled to the data input of the flip-flop and to a functional path input of the second circuitry core.

2. The integrated circuit of claim 1 wherein the first and second circuitry cores comprise respective read channel and additional cores of a system-on-chip.

3. The integrated circuit of claim 1 wherein the scan test circuitry is configured for separate scan testing of the first and second circuitry cores.

4. The integrated circuit of claim 3 wherein the wrapper cell scan chain is configured such that functional paths between the first circuitry core and the wrapper cell scan chain are scan tested in conjunction with scan testing of the first circuitry core and functional paths between the wrapper cell scan chain and the second circuitry core are scan tested in conjunction with scan testing of the second circuitry core.

5. The integrated circuit of claim 1 wherein:
   the multiplexer has a select line;
   the flip-flop has a data output;
   the functional path input of the multiplexer is coupled to a functional path output of the first circuitry core;
   the select line of the multiplexer is adapted to receive a scan shift enable signal;
   the data output of the flip-flop is coupled to a scan shift input of another multiplexer in a next wrapper cell of the wrapper cell scan chain; and
   the scan shift input of the multiplexer is coupled to a data output of another flip-flop of a previous wrapper cell of the wrapper cell scan chain.

6. The integrated circuit of claim 1 wherein the wrapper cell scan chain is configured such that a scan shift input of a given wrapper cell other than an initial wrapper cell of the wrapper cell scan chain is coupled to a data output of a flip-flop of a previous wrapper cell of the wrapper cell scan chain.

7. The integrated circuit of claim 1 wherein the wrapper cell scan chain is configured such that a data output of a flip-flop of a given wrapper cell other than a final wrapper cell of the wrapper cell scan chain is coupled to a scan shift input of a next wrapper cell of the wrapper cell scan chain.

8. The integrated circuit of claim 1 wherein the wrapper cell scan chain is configured such that at least one of the wrapper cells has a functional path input that is coupled to a functional path output of the first circuitry core and a functional path output that is coupled to the functional path input of the second circuitry core.

9. A hard disk drive controller comprising the integrated circuit of claim 1.

10. A method of scan testing an integrated circuit, comprising:
controlling at least one wrapper cell scan chain arranged between first and second circuitry cores of the integrated circuit, the wrapper cell scan chain comprising a plurality of wrapper cells and being configurable to operate as a serial shift register in a scan shift mode of operation; and
scan testing functional paths between the first and second circuitry cores utilizing the wrapper cell scan chain;
wherein at least one of the wrapper cells of the wrapper cell scan chain comprises:
a flip-flop having a data input and a throughput data path that is part of a scan shift path of the wrapper cell scan chain and not part of a functional path between the first and second circuitry cores; and
a multiplexer having a functional path input, a scan shift input and an output; and
wherein the output of the multiplexer is coupled to the data input of the flip-flop and to a functional path input of the second circuitry core.

11. The method of claim 10 wherein said scan testing further comprises performing separate scan testing of the first and second circuitry cores.

12. The method of claim 11 wherein said scan testing further comprises scan testing functional paths between the first circuitry core and the wrapper cell scan chain in conjunction with scan testing of the first circuitry core and scan testing functional paths between the wrapper cell scan chain and the second circuitry core in conjunction with scan testing of the second circuitry core.

13. The method of claim 10 wherein the wrapper cell scan chain is configured such that a scan shift input of a given wrapper cell other than an initial wrapper cell of the wrapper cell scan chain is coupled to a data output of a flip-flop of a previous wrapper cell of the wrapper cell scan chain.

14. The method of claim 10 wherein the wrapper cell scan chain is configured such that a data output of a flip-flop of a given wrapper cell other than a final wrapper cell of the wrapper cell scan chain is coupled to a scan shift input of a next wrapper cell of the wrapper cell scan chain.

15. The method of claim 10 wherein the wrapper cell scan chain is configured such that at least one of the wrapper cells has a functional path input that is coupled to a functional path output of the first circuitry core and a functional path output that is coupled to the functional path input of the second circuitry core.

16. A computer program product comprising a non-transitory computer-readable storage medium having computer program code embodied therein for use in scan testing an integrated circuit, wherein the computer program code when executed in a testing system causes the testing system to perform the steps of the method of claim 10.

17. A processing system comprising:
a processor; and
a memory coupled to the processor and configured to store information characterizing an integrated circuit design;
wherein the processing system is configured to modify the integrated circuit design by providing at least one wrapper cell scan chain arranged between first and second circuitry cores of the integrated circuit, the wrapper cell scan chain comprising a plurality of wrapper cells and being configurable to operate as a serial shift register in a scan shift mode of operation;
wherein at least one of the wrapper cells of the wrapper cell scan chain comprises:
a flip-flop having a data input and a throughput data path that is part of a scan shift path of the wrapper cell scan chain and not part of a functional path between the first and second circuitry cores; and
a multiplexer having a functional path input, a scan shift input and an output; and
wherein the output of the multiplexer is coupled to the data input of the flip-flop and to a functional path input of the second circuitry core.

18. An apparatus for use in scan testing an integrated circuit having first and second circuitry cores, the apparatus comprising:
a wrapper cell configurable with a plurality of other wrapper cells into a wrapper cell scan chain for arrangement between the first and second circuitry cores;
wherein the wrapper cell comprises:
a flip-flop having a data input and a throughput data path that is part of a scan shift path of the wrapper cell scan chain and not part of a functional path between the first and second circuitry cores; and
a multiplexer having a functional path input, a scan shift input and an output; and
wherein the output of the multiplexer is coupled to the data input of the flip-flop and to a functional path input of the second circuitry core.

19. The apparatus of claim 18 wherein:
the multiplexer has a select line;
the flip-flop has a output;
the functional path input of the multiplexer is coupled to a functional path output of the first circuitry core;
the select line of the multiplexer is adapted to receive a scan shift enable signal;
the data output of the flip-flop is coupled to a scan shift input of another multiplexer in a next wrapper cell of the wrapper cell scan chain; and
the scan shift input of the multiplexer is coupled to a data output of another flip-flop of a previous wrapper cell of the wrapper cell scan chain.

20. The apparatus of claim 18 wherein the flip-flop is a non-resettable flip-flop.

* * * * *

UNITED STATES PATENT AND TRADEMARK OFFICE
CERTIFICATE OF CORRECTION

PATENT NO. : 8,738,978 B2  
APPLICATION NO. : 13/173144  
DATED : May 27, 2014  
INVENTOR(S) : Ramesh C. Tekumalla et al.

Page 1 of 1

It is certified that error appears in the above-identified patent and that said Letters Patent is hereby corrected as shown below:

On the Title Page, Item (54) and in the Specification, Column 1, line 2:

In the Title, please insert --CIRCUITS-- after "INTEGRATED"

In the Specification:

Column 6, line 34, please insert --are-- before "deterministic"

In the Claims:

Claim 19, column 10, line 50, please insert --data-- before "output"

Signed and Sealed this
Twenty-sixth Day of August, 2014

Michelle K. Lee
*Deputy Director of the United States Patent and Trademark Office*